(12) United States Patent
Kim et al.

(10) Patent No.: US 8,890,155 B2
(45) Date of Patent: Nov. 18, 2014

(54) DISPLAY DEVICE

(71) Applicant: Samsung Display Co., Ltd., Yongin (KR)

(72) Inventors: Young Gu Kim, Hwaseong-si (KR); Byoung-Hun Sung, Hwaseong-si (KR); Baek Kyun Jeon, Yongin-si (KR); Jin-Soo Jung, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 11 days.

(21) Appl. No.: 13/737,054

(22) Filed: Jan. 9, 2013

(65) Prior Publication Data

US 2014/0070218 A1 Mar. 13, 2014

(30) Foreign Application Priority Data

Sep. 7, 2012 (KR) ........................ 10-2012-0099358

(51) Int. Cl.
*H01L 31/00* (2006.01)
*H01L 27/32* (2006.01)
*H01L 27/15* (2006.01)

(52) U.S. Cl.
CPC ................ *H01L 27/15* (2013.01); *H01L 27/32* (2013.01)
USPC .......................................... 257/59; 349/149

(58) Field of Classification Search
None
See application file for complete search history.

(56) References Cited

U.S. PATENT DOCUMENTS

| | | | |
|---|---|---|---|
| 5,721,164 A | 2/1998 | Wu | |
| 6,627,485 B2 | 9/2003 | Murade | |
| 6,897,841 B2 | 5/2005 | Ino | |
| 7,333,167 B2 | 2/2008 | Kawase | |
| 7,394,514 B2 | 7/2008 | Hayashi et al. | |
| 7,524,689 B2 | 4/2009 | Kato et al. | |
| 7,623,205 B2 | 11/2009 | Kim | |
| 8,127,438 B2 | 3/2012 | Hara | |
| 2003/0062542 A1* | 4/2003 | Murade | 257/200 |
| 2006/0132695 A1 | 6/2006 | Mizuno | |
| 2007/0091232 A1 | 4/2007 | Kim et al. | |
| 2009/0002590 A1 | 1/2009 | Kimura | |
| 2011/0149196 A1 | 6/2011 | Tanaka | |
| 2011/0248291 A1* | 10/2011 | Jinbo et al. | 257/88 |
| 2011/0267297 A1 | 11/2011 | Yamazaki et al. | |
| 2012/0127405 A1* | 5/2012 | Lee et al. | 349/106 |
| 2013/0148072 A1* | 6/2013 | Jang et al. | 349/150 |

FOREIGN PATENT DOCUMENTS

| | | | |
|---|---|---|---|
| KR | 1020040005040 | 1/2004 | |
| KR | 1020060012804 | 2/2006 | |
| KR | 1020060038148 | 5/2006 | |
| KR | 10-0806182 | 2/2008 | |
| KR | 1020090061469 | 6/2009 | |
| KR | 20130064507 A * | 6/2013 | 349/150 |

* cited by examiner

*Primary Examiner* — Whitney T Moore
*Assistant Examiner* — Joseph Galvin, III
(74) *Attorney, Agent, or Firm* — F. Chau & Associates, LLC

(57) ABSTRACT

A display device includes: a first display panel including a display area and a peripheral area, a flexible film disposed in the peripheral area, a thin film transistor disposed on the display area while being adjacent to the flexible film, a second display panel facing the first display panel and a sealant disposed in the peripheral area of the first display panel to attach the first display panel and the second display panel, and the first display panel includes: a substrate, a data wiring layer disposed on the substrate and in contact with a side end of the flexible film, a semiconductor layer disposed on the data wiring layer, an interlayer insulating layer disposed on the semiconductor layer and a gate wiring layer disposed on the interlayer insulating layer.

21 Claims, 6 Drawing Sheets

DISPLAY DEVICE

CROSS-REFERENCE TO RELATED APPLICATION

This application claims priority to Korean Patent Application No. 10-2012-0099358 filed on Sep. 7, 2012, the disclosure of which is hereby incorporated by reference herein in its entirety.

TECHNICAL FIELD

The present disclosure relates to a display device.

DISCUSSION OF THE RELATED ART

A liquid crystal display is one of the currently most widely used flat panel displays, and includes two display panels in which electric field generation electrodes, such as, for example, a pixel electrode and a common electrode, are formed, and a liquid crystal layer interposed therebetween.

An electric field is generated in the liquid crystal layer by applying a voltage to the electric field generating electrode, orientation of liquid crystal molecules is determined through the generated electric field, and polarization of incident light is controlled, so that an image is displayed.

In addition, a flat display device includes, for example, a plasma display device, an organic light emitting device, an electrophoretic display, and an electrowetting display device.

Recently, display devices have become gradually lighter and thinner, and consume less power. Along with such a trend, a width of a bezel portion of a display device has correspondingly decreased. When a width of a bezel portion is decreased, there may be benefits in that a display device looks sleek, thereby obtaining an excellent design, and an interval between adjacent display panels may be decreased when a large display device is manufactured by using several display panels.

To decrease a width of a bezel portion, it may be necessary to decrease a width of a peripheral area surrounding a display area. However, there may be a limit to the amount that the width of the peripheral area may be decreased because various wirings, driving units, and sealants are attached to the peripheral area of a display panel.

SUMMARY OF THE INVENTION

Exemplary embodiments of the present invention provide a display device having a small bezel. An exemplary embodiment of the present invention provides a display device including: a first display panel including a display area and a peripheral area, a flexible film disposed in the peripheral area, a thin film transistor disposed on the display area and adjacent to the flexible film, a second display panel facing the first display panel; and a sealant disposed in the peripheral area of the first display panel and to attach the first display panel and the second display panel, and the first display panel includes a substrate, a data wiring layer disposed on the substrate and in contact with a side end of the flexible film, a semiconductor layer disposed on the data wiring layer, an interlayer insulating layer disposed on the semiconductor layer and a gate wiring layer disposed on the interlayer insulating layer.

The gate wiring layer may cover a lateral surface and an upper surface of the side end of the flexible film.

The data wiring layer and the semiconductor layer may be in contact with the one side end of the flexible film to form a mounting block, and the gate wiring layer may cover the flexible film over the mounting block and extends from the display area to the peripheral area.

The first display panel and the second display panel may be disposed in a flipped structure, the first display panel may be disposed on the second display panel, and a backlight unit may be disposed under the second display panel.

The display device may further include a black matrix disposed between the substrate and the data wiring layer included in the first display panel.

The flexible film may be disposed only in the peripheral area.

The flexible film may be formed of at least one of polyimide, polyethylene terephthalate, polycarbonate, polyethylene naphthalate, and polyacrylate.

The display device may further include a gate insulating layer disposed on the gate wiring layer.

The sealant may be positioned between the gate insulating layer and the second display panel in the peripheral area.

A backlight unit may be disposed under the first display panel, the second display panel is disposed on the first display panel, and the display device may further include a light blocking film disposed between the substrate and the semiconductor layer included in the first display panel.

The light blocking film may include a metal material capable of reflecting light.

The light blocking film may include one of aluminum, copper or chromium.

The display device may further include a first ohmic contact layer and second ohmic contact layer disposed on the data wiring layer, and wherein the data wiring layer includes a source electrode and a drain electrode spaced apart from each other on the substrate of the first display panel.

The display device may further include the first ohmic contact layer and the second ohmic contact layer are disposed on the source electrode and the drain electrode, respectively and wherein the source electrode, the first ohmic contact layer and the semiconductor layer disposed on the source electrode and the interlayer insulating layer are in contact with the side surface of the end of the flexible film.

In accordance with an exemplary embodiment of the present invention, a display device is provided. The display device includes a first display panel including a display area and a peripheral area, a flexible film disposed in the peripheral area, a thin film transistor disposed on the display area and adjacent to the flexible film, a second display panel facing the first display panel, a sealant disposed in the peripheral area of the first display panel to attach the first display panel and the second display panel. The first display panel and the second display panel are disposed in a flipped structure, and the first display panel is disposed on the second display panel.

The display device further includes a backlight unit disposed under the second display panel, and the first display panel includes a substrate, a data wiring layer disposed on the substrate and in contact with a side end of the flexible film, and the data wiring layer includes a source electrode and a drain electrode spaced apart from each other on the substrate of the first display panel, a semiconductor layer disposed on the data wiring layer, an interlayer insulating layer disposed on the semiconductor layer, a gate wiring layer including a gate electrode disposed on the interlayer insulating layer, a gate insulating layer disposed on the gate wiring layer, and the gate wiring layer and the gate insulating layer disposed on the substrate of the first display panel extend from the display area to the peripheral area and the gate wiring layer and gate insulating layer cover the flexible film while passing over a stepped portion of the flexible film at a boundary portion of the display area and the peripheral area.

In addition, the display device further includes a black matrix disposed on the first display panel between a common surface defined by the source electrode, the drain electrode, the semiconductor layer and the substrate of the first display panel.

The flexible film may be bent along a side surface of the sealant.

The source electrode may be in contact with the side end of the flexible film.

As described above, according to an exemplary embodiment of the present invention, the thin film transistor adjacent to the flexible film is formed in a top gate structure, so that the gate wiring is extended by using the data wiring layer and the semiconductor layer as the mounting block. Accordingly, it is possible to prevent disconnection of the gate wiring.

Further, the display panel including a thin film transistor formed in a structure of the top gate is flipped so that the gate wiring layer serves a function of blocking light for light generated in the backlight unit, thereby preventing a change of a characteristic of the thin film transistor.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Figure 1:
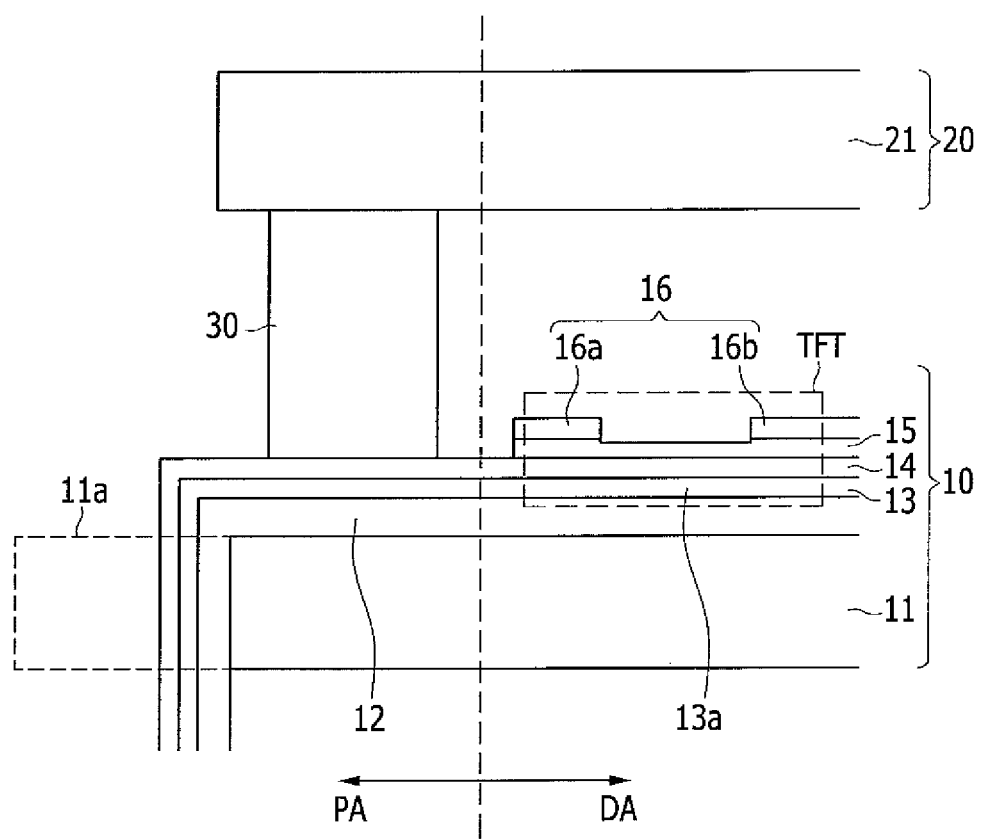
FIG. 1 is a cross-sectional view illustrating a display device according to a comparative example.

Exemplary embodiments of the present invention will be described in detail with reference to the accompanying drawings.

In the drawings, the thickness of layers, films, panels, regions, etc., may be exaggerated for clarity. Further, it will be understood that when a layer is referred to as being "on" another layer or substrate, it can be directly on the other layer or substrate, or intervening elements may also be present. Like reference numerals designate like elements throughout the specification.

As used herein, the singular forms, "a", "an", and "the" are intended to include plural forms as well, unless the context clearly indicates otherwise.

Figure 2:
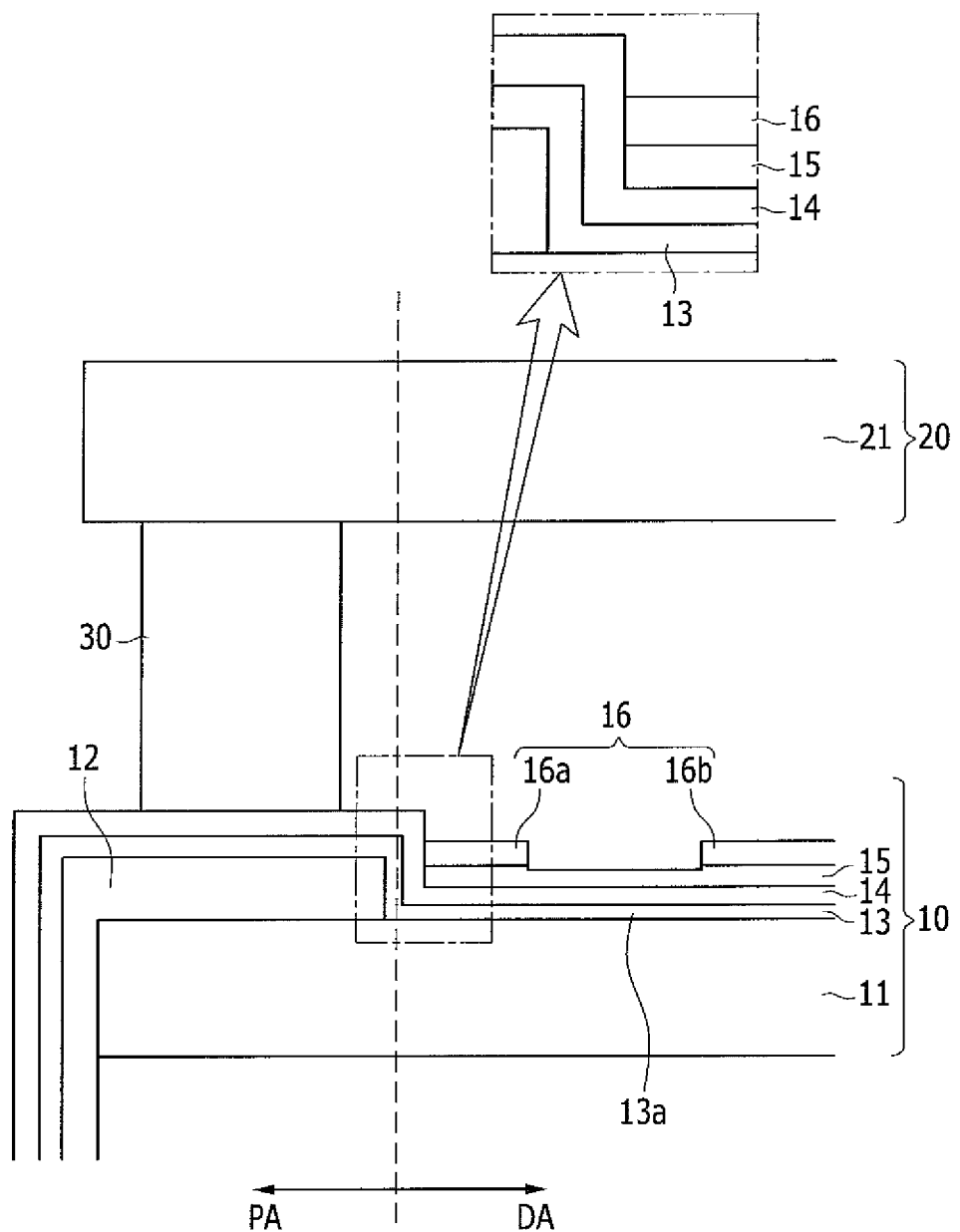
FIG. 2 is a cross-sectional view illustrating a display device according to an exemplary embodiment of the present invention.

FIG. 1 is a cross-sectional view illustrating a display device according to a comparative example, and FIG. 2 is a cross-sectional view illustrating a display device according to an exemplary embodiment of the present invention.

First, a first display panel 10 on which a thin film transistor is formed will be described with reference to FIG. 1. The first display panel 10 includes, for example, a substrate 11 and a flexible film 12 positioned on the substrate 11. The substrate 11 may be an insulation substrate made of, for example, transparent glass, quartz or plastic. Further, in an exemplary embodiment, the glass may include, for example, tempered glass. In an exemplary embodiment, the substrate 11 may be formed of, for example, one of polycarbonate (PC), polyester (PET), polypropylene (PP), polyethylene (PE) and polymethyl methacrylate (PMMA).

A driving unit may be formed on the flexible film 12 positioned in a peripheral area PA, and the flexible film 12 may be, for example, bent while surrounding the substrate 11 to have a small bezel. A gate wiring layer 13 and a gate insulating layer 14 are positioned on the flexible film 12, and the gate wiring layer and the gate insulating layer 14 may extend from a display area DA to the peripheral area PA. The gate insulating layer 14 may include an insulating dielectric or metal oxide dielectric formed of a combination of one or more selected from the group consisting of aluminum oxide ($Al_2O_3$), silicon oxide ($SiO_2$), silicon nitride ($SiN_x$), zirconium oxide ($ZrO_2$), hafnium oxide ($HfO_2$), titanium oxide ($TiO_2$), tantalum oxide ($Ta_2O_5$), a barium-strontium-titanium-oxygen (Ba—Sr—Ti—O) compound, and a bismuth-zinc-niobium-oxygen (Bi—Zn—Nb—O) compound.

Although, it is not illustrated, a contact hole may be formed in the gate insulating layer 14 in the peripheral area PA to connect the gate wiring layer 13 and the driving unit. The driving unit may be formed, for example, at a portion in which the flexible film 12 is bent.

A semiconductor layer 15 is positioned on a gate insulating layer 14 in the display area DA. The data wiring layer 16 is positioned on the semiconductor layer 15. For example, the semiconductor layer 15 may include oxide semiconductors (such as, an IGZO film, an InGaZnO film, a ZnO film, and an $SnO_2$ film), single crystal silicon, polysilicon, amorphous silicon, or a compound semiconductor.

The data wiring layer 16 includes, for example, a source electrode 16a and a drain electrode 16b facing each other. The source electrode 16a and the drain electrode 16b may each be, for example, a single-layered structure formed of a material including chromium (Cr), tungsten (W), titanium (Ti), tantalum (Ta), molybdenum (Mo), aluminum (Al), copper (Cu), and an alloy thereof. Alternatively, for example, the source electrode 16a and the drain electrode 16b may each be a multi-layered structure formed of a combination of materials including Cr, W, Ti, Ta, Mo, Al, Cu and an alloy thereof.

Although it is not illustrated, a passivation layer and a pixel electrode are formed on the data wiring layer 16, and the pixel electrode and the drain electrode 16b may be electrically connected through the contact hole formed on the passivation layer.

As illustrated in FIG. 1, the gate wiring layer 13 includes, for example, a gate electrode 13a positioned at a portion corresponding to the semiconductor layer 15. The gate electrode 13a, the source electrode 16a, and the drain electrode 16b, which are constituent elements of three terminals, form a thin film transistor (TFT). The thin film transistor (TFT) illustrated in FIG. 1 may be a thin film transistor formed in a pixel area positioned at, for example, a portion most adjacent to the peripheral area PA.

The gate electrode 13a may be, for example, a single-layered structure formed of a material including chromium (Cr), tungsten (W), titanium (Ti), tantalum (Ta), molybdenum (Mo), aluminum (Al), copper (Cu), and an alloy thereof. Alternatively, for example, the gate electrode 13a may be a multi-layered structure formed of a combination of materials including Cr, W, Ti, Ta, Mo, Al, Cu and an alloy thereof.

A second display panel 20 is positioned at a position facing the first display panel 10. Although it is not illustrated in the second display panel 20, a common electrode, a color filter, a black matrix, and a common electrode may be formed on the substrate 21. However, the common electrode formed on the second display panel 20 may be formed on the first display panel 10 according to a mode of liquid crystal, and the color filter or the black matrix formed on the second display panel 20 may be formed on the first display panel 10 for increasing an aperture ratio and the like.

The substrate 21 may be an insulation substrate made of, for example, transparent glass, quartz or plastic. Further, in an exemplary embodiment, the glass may include, for example, tempered glass. In an exemplary embodiment, the substrate 21 may be formed of, for example, one of polycarbonate (PC), polyester (PET), polypropylene (PP), polyethylene (PE) and polymethyl methacrylate (PMMA).

The first display panel 10 and the second display panel 20 may be attached by, for example, a sealant 30 formed in the peripheral area PA, and a liquid crystal layer may be formed between the first display panel 10 and the second display panel 20.

As illustrated in the comparative example of FIG. 1, when the driving unit is formed in a pad area by using the flexible film 12, the bezel may be decreased by a size slightly smaller than that of a substrate region 11a. When the flexible film 12 is formed on the substrate 11, the flexible film 12 may be formed up to the display area DA without removing a partial part thereof in terms of processing capacity. However, when the flexible film 12 is formed up to the display area DA, transmittance may be deteriorated, and light leakage due to a phase delay value Rth of the flexible film 12 may be generated.

To solve the aforementioned difficulties, the flexible film 12 may be removed from the display area DA and may be formed in the peripheral area DA according to an exemplary embodiment of the present invention. Hereinafter, the exemplary embodiment will be described with reference to FIG. 2.

Referring to FIG. 2, contrary to the comparative example of FIG. 1, the flexible film 12 is removed from the display area DA, and a step is formed at a boundary portion of the display area DA and the peripheral area PA. In the present exemplary embodiment, as the flexible film 12 is removed from the display area DA, transmittance is less deteriorated and light leakage is less generated.

When the gate wiring layer 13 and the gate insulating layer 14 formed on the substrate 11 extend from the display area DA to the peripheral area PA, the gate wiring layer 13 and the gate insulating layer 14 cover the flexible film 12 while passing over a stepped portion of the flexible film 12. The flexible film 12 may be required to be formed with a predetermined thickness to prevent the flexible film 12 from being torn due to deterioration of the mechanical characteristic. Accordingly, the gate wiring layer 13 and the gate insulating layer 14 are easily disconnected at a portion at which the gate wiring layer 13 passes over the stepped portion of the flexible film 12.

Hereinafter, an exemplary embodiment capable of solving the aforementioned difficulties will be described with reference to FIG. 3.

Figure 3:
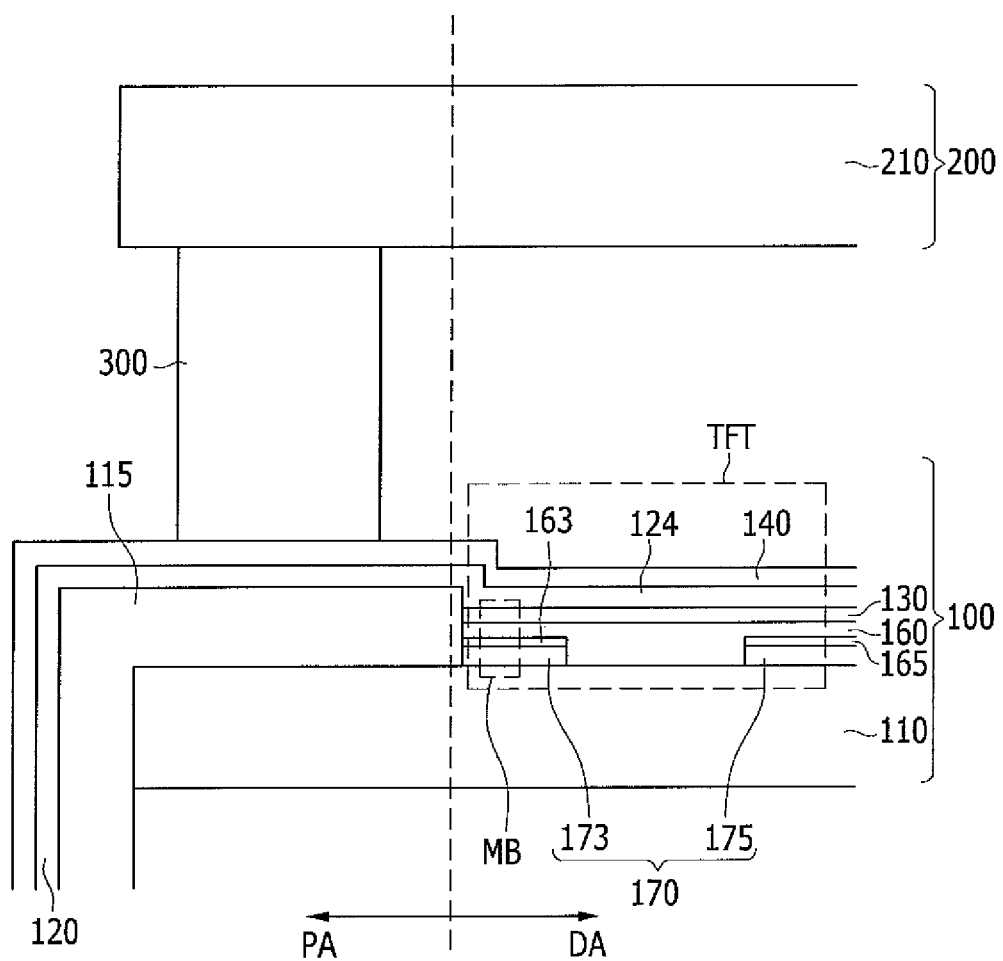
FIG. 3 is a cross-sectional view illustrating a display device according to an exemplary embodiment of the present invention.

FIG. 3 is a cross-sectional view illustrating a display device according to an exemplary embodiment of the present invention.

First, the first display panel 100 on which the thin film transistor is formed will be described with reference to FIG. 3. A first display panel 100 includes, for example, a substrate 110 and a flexible film 115 positioned on the substrate 110. For example, a driving unit may, for example, be formed on the flexible film 115 positioned in the peripheral area PA, and the flexible film 115 may be bent while surrounding the substrate 110 to have a small bezel.

In the present exemplary embodiment, the flexible film 115 may be formed of, for example, at least one of polyimide, polyethylene terephthalate, polycarbonate, polyethylene naphthalate, and polyacrylate.

In the present exemplary embodiment, the flexible film 115 is positioned, for example, in a peripheral area PA, and a source electrode 173 and a drain electrode 175 facing each other are positioned, for example, on the substrate 110 in a display area DA. The source electrode 173 and the drain electrode 175 become terminals of the thin film transistor, and although it is not illustrated, the source electrode 173 may be connected with a data line.

Ohmic contact layers 163 and 165 are positioned on the source electrode 173 and the drain electrode 175, respectively, and a semiconductor layer 160 is positioned on the ohmic contact layers 163 and 165. In a semiconductor layer 160, a channel part may be formed between the source electrode 173 and the drain electrode 175. It is illustrated in the present exemplary embodiment that an interlayer insulating layer 130 is positioned on the semiconductor layer 160 and the interlayer insulating layer 130 is formed in the display area DA. In an exemplary embodiment, the interlayer insulating layer 130 may also extend so as to cover the flexible film 115 positioned in the peripheral area PA A gate wiring layer 120 including, for example, a gate electrode 124 and a gate insulating layer 140 are positioned on the interlayer insulating layer 130. The gate wiring layer 120 and the gate insulating layer 140 may, for example, extend from the display area DA to the peripheral area PA. Although, it is not illustrated, a contact hole may be formed in the gate insulating layer 140 in the peripheral are PA to connect the gate wiring layer 120 and the driving unit. The driving unit may be formed, for example, at a portion at which the flexible film 115 is bent.

Although it is not illustrated, a pixel electrode is formed on the gate insulating layer 140, and the contact hole is formed, for example, at a portion of the gate insulating layer 140 overlapping a portion in which the gate wiring layer 120 is not formed, so that the pixel electrode and the drain electrode 175 may be electrically connected through the contact hole.

As illustrated in FIG. 3, the gate electrode 124, the source electrode 173, and the drain electrode 175, which are constituent elements of three terminals, form the thin film transistor TFT. The thin film transistor (TFT) illustrated in FIG. 3 may be, for example, a thin film transistor formed in a pixel area positioned at a portion most adjacent to the peripheral area PA. In the present exemplary embodiment, the thin film transistor (TFT) is formed in a top gate structure.

A second display panel 200 is positioned at a position facing the first display panel 100. Although it is not illustrated, a common electrode, a color filter, a black matrix, and a common electrode may be formed on the substrate 210 of the second display panel 200. However, alternatively, in an exemplary embodiment, the common electrode may be formed on the first display panel 100 according to a mode of liquid crystal, and the color filter or the black matrix may be formed on the first display panel 100 for increasing an aperture ratio and the like.

The first display panel 100 and the second display panel 200 may be attached by, for example, a sealant 300 formed in the peripheral area PA, and a liquid crystal layer may be formed between the first display panel 100 and the second display panel 200.

In the present exemplary embodiment, a stepped portion of the flexible film 115 formed at a boundary portion of the peripheral area PA, that is, one side end of the flexible film 115, and a data wiring layer 170 are in contact with each other. For example, the source electrode 173 in the data wiring layer 170, the ohmic contact layer 163 and the semiconductor layer 160 positioned on the source electrode 173, and the interlayer insulating layer 130 are in contact with a side surface of the one side end of the flexible film 115. Here, the source electrode 173, the ohmic contact layer 163, the semiconductor layer 160, and the interlayer insulating layer 130 form a mounting block MB. As the mounting block MB decreases the step of the flexible film 115, it is possible to prevent the gate wiring layer 120 and the gate insulating layer 140 from being disconnected at a portion at which the gate wiring layer 120 and the gate insulating layer 140 pass over the stepped portion. Here, the ohmic contact layer 163 and the interlayer insulating layer 130 are included in constituent elements forming the mounting block MB. However, in a structure of a thin film transistor in which the ohmic contact layer 163 may be omitted or a structure in which the interlayer insulating layer 130 extends over the flexible film 115, the mounting block may consist of, for example, the source electrode 173 and the semiconductor layer 160. Further, the mounting block may be formed of, for example, the drain electrode 175, not the source electrode 173, through a structure change.

According to the present exemplary embodiment of FIG. 3, a backlight unit may be disposed, for example, at a lower end of the first display panel 100 in a case of a liquid crystal display. Light generated in the backlight unit passes through the first display panel 100, the liquid crystal layer, and the second display panel 200 to cause an observer to view an image displayed in the display device. In this case, the light generated in the backlight unit exerts an influence on the channel part of the semiconductor layer 160, especially the channel part of the semiconductor layer 160, due to the top gate structure, thereby changing a characteristic of the thin film transistor TFT. Accordingly, a modified exemplary embodiment for preventing the change of the characteristic of the thin film transistor TFT will be described hereinafter.

Figure 4:
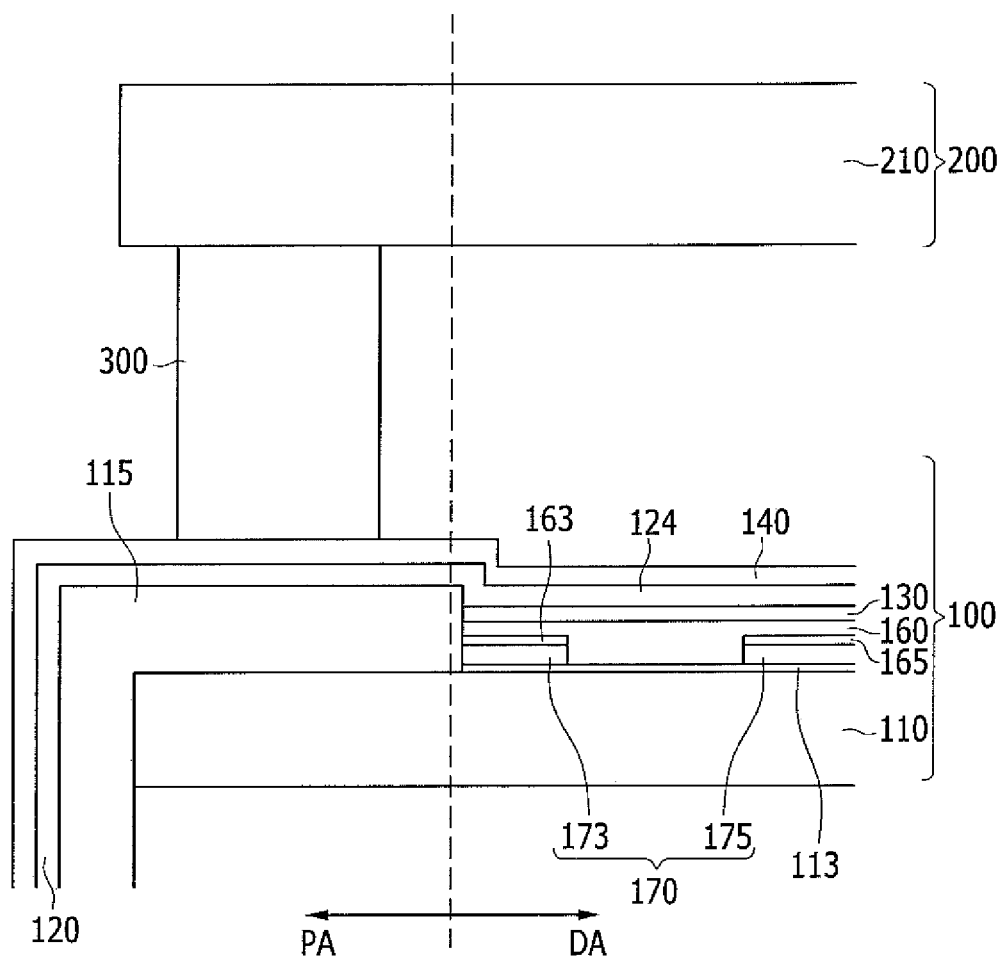
FIG. 4 is a cross-sectional view illustrating a display device according to an exemplary embodiment of the present invention.

FIG. 4 is a cross-sectional view illustrating a display device according to an exemplary embodiment of the present invention.

Referring to FIG. 4, most configurations of FIG. 4 are the same as those of the exemplary embodiment described with reference to FIG. 3. However, a light blocking film 113 is formed on the substrate 110 of the first display panel 100 to prevent the light generated in the backlight unit from directly reaching the semiconductor layer 160. The light blocking film 113 may be formed of, for example, a metal material capable of reflecting light. The metal material of the light blocking film 113 includes, for example, aluminum, copper, and chromium.

Figure 5:
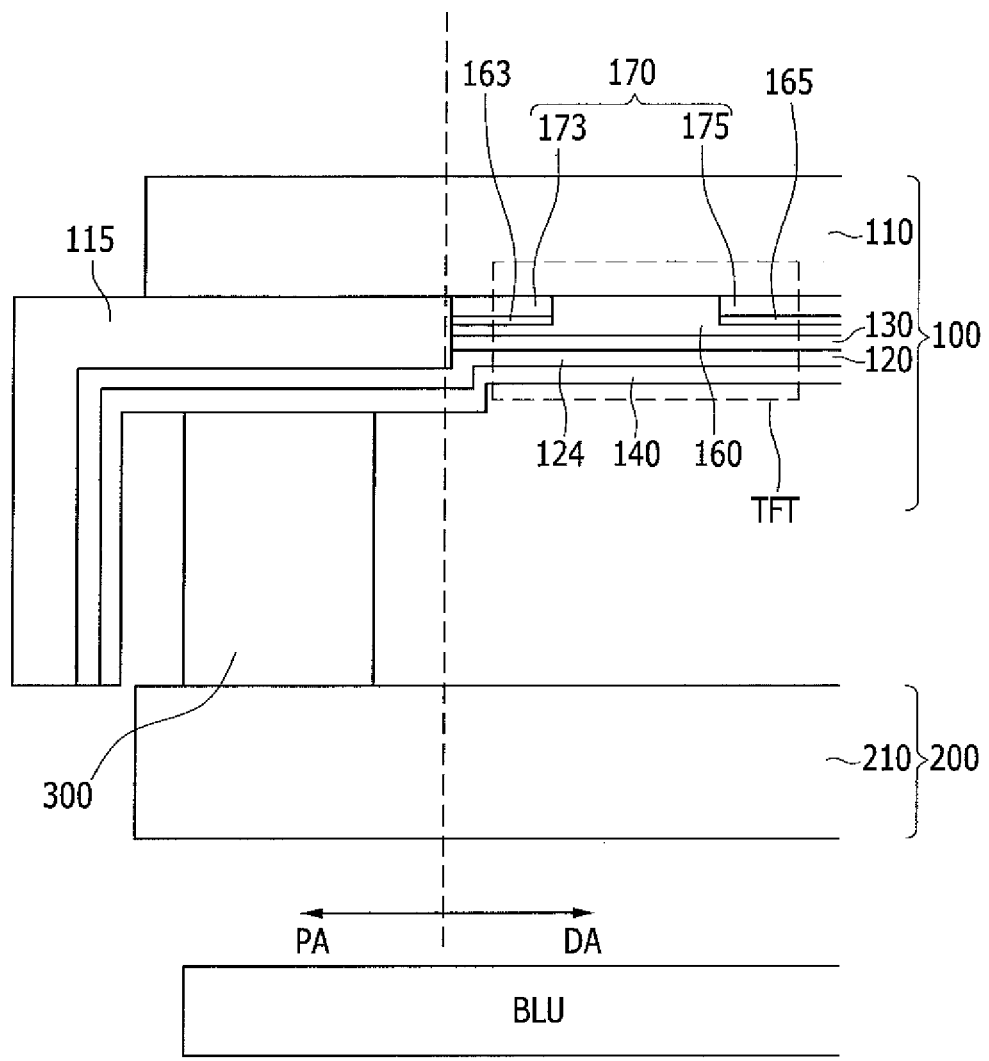
FIG. 5 is a cross-sectional view illustrating a display device according to an exemplary embodiment of the present invention.

FIG. 5 is a cross-sectional view illustrating a display device according to an exemplary embodiment of the present invention.

Referring to FIG. 5, the display device according to the present exemplary embodiment includes a structure in which the first display panel 100 is flipped in the exemplary embodiment aforementioned with reference to FIG. 3. Further, a position of the second display panel 200 is changed with a position of the first display panel 100 to be positioned adjacent to a backlight unit BLU.

In the present exemplary embodiment, the light generated in the backlight unit BLU may, for example, pass the second display panel 200 and the liquid crystal layer positioned between the second display panel 200 and the first display panel 100 to be incident to the first display panel 100. In this case, the incident light is blocked by the gate electrode 124 included in the gate wiring layer 120 so that the incident light does not reach the channel part of the semiconductor layer 160. Accordingly, the characteristic of the thin film transistor TFT including the channel part of the semiconductor layer 160 may be maintained.

In the present exemplary embodiment, a driving unit may, for example, be formed on the flexible film 115 positioned in the peripheral area PA, and the flexible film 115 may be bent along a side surface of the sealant 300 to have a small bezel.

In the present exemplary embodiment, the flexible film 115 may be formed of, for example, at least one of polyimide, polyethylene terephthalate, polycarbonate, polyethylene naphthalate, and polyacrylate.

Figure 6:
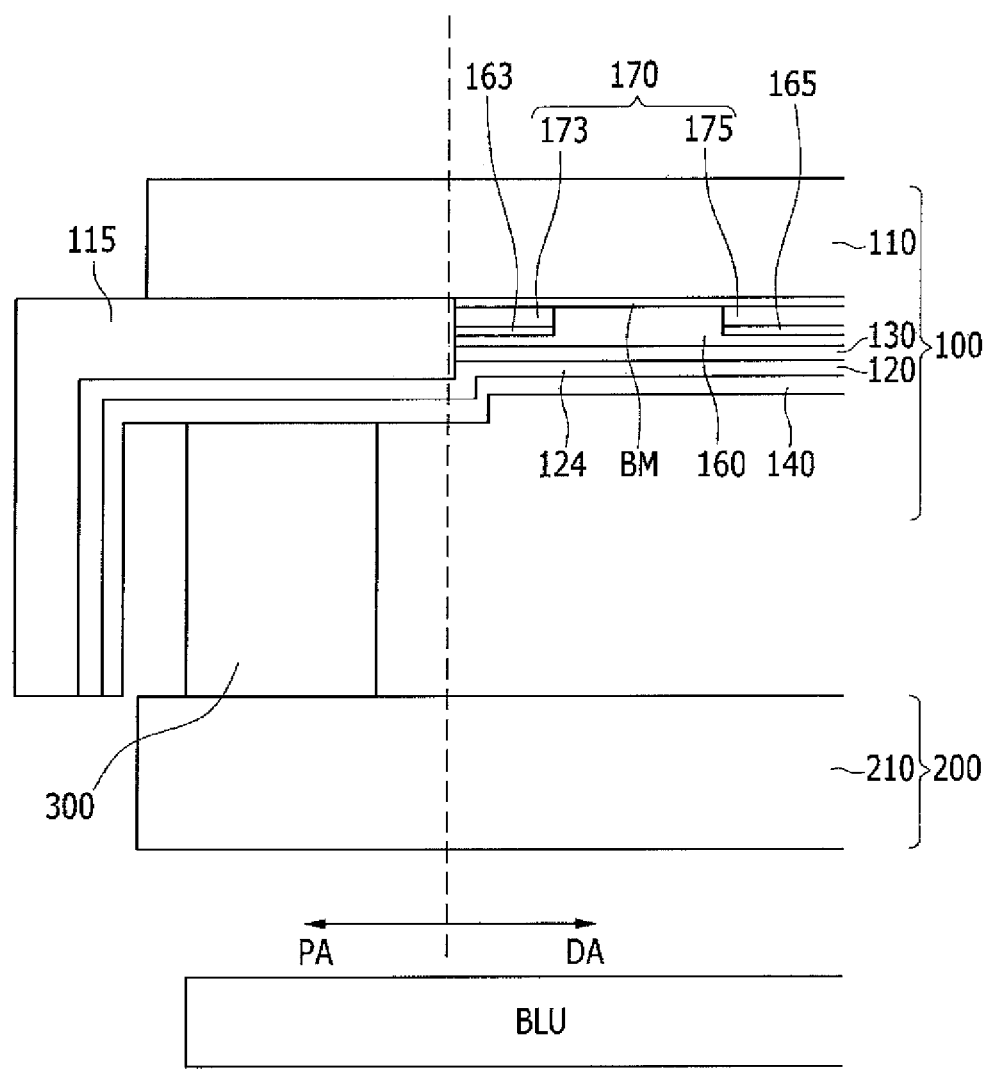
FIG. 6 is a cross-sectional view illustrating a display device according to an exemplary embodiment of the present invention.

FIG. 6 is a cross-sectional view illustrating a display device according to an exemplary embodiment of the present invention.

Referring to FIG. 6, most configurations of FIG. 6 are the same as those of the exemplary embodiment described with reference to FIG. 5. In the present exemplary embodiment of FIG. 5, external light generated from an upper portion of the first display panel 100 may enter inside the first display panel 100, and the external light may directly reach the semiconductor layer 160, to cause the characteristic of the thin film transistor TFT to be changed. To solve the above-mentioned difficulties, a black matrix BM is positioned between a common surface formed by the source electrode 173, the drain electrode 175, and the semiconductor layer 160 and the substrate 110 in the exemplary embodiment described with reference to FIG. 6. The black matrix BM is formed of, for example, a light blocking material, so that it is possible to prevent the external light from reaching the channel part of the semiconductor layer 160. Further, as the black matrix BM may further decrease a step generated due to the flexible film 115, an effect of preventing the gate wiring layer 120 from being disconnected at the portion at which the gate wiring layer 120 passes over the stepped portion of the flexible film 115 may be considerably increased.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:
1. A display device, comprising:
a first display panel including a display area and a peripheral area;
a flexible film disposed in the peripheral area;
a thin film structure disposed on the display area and adjacent to the flexible film;
a second display panel facing the first display panel; and
a sealant disposed in the peripheral area of the first display panel to attach the first display panel and the second display panel,
wherein the thin film structure comprises:
a substrate;
a data wiring layer disposed on the substrate and in contact with a side end of the flexible film;
a semiconductor layer disposed on the data wiring layer;
an interlayer insulating layer disposed on the semiconductor layer; and
a gate wiring layer disposed on the interlayer insulating layer.

2. The display device of claim 1, wherein the gate wiring layer covers a lateral surface and an upper surface of the side end of the flexible film.

3. The display device of claim 2, wherein the data wiring layer and the semiconductor layer are in contact with the side end of the flexible film to form a mounting block, and the gate wiring layer covers the flexible film over the mounting block and extends from the display area to the peripheral area.

4. The display device of claim 3, wherein the first display panel and the second display panel are disposed in a flipped structure, the first display panel is disposed on the second display panel, and a backlight unit is disposed under the second display panel.

5. The display device of claim 4, further comprising:
a black matrix disposed between the substrate and the data wiring layer included in the first display panel.

6. The display device of claim 5, wherein the flexible film is disposed only in the peripheral area.

7. The display device of claim 6, wherein the flexible film includes at least one of polyimide, polyethylene terephthalate, polycarbonate, polyethylene naphthalate, and polyacrylate.

8. The display device of claim 1, further comprising:
a gate insulating layer disposed on the gate wiring layer.

9. The display device of claim 8, wherein the sealant is disposed between the gate insulating layer and the second display panel in the peripheral area.

10. The display device of claim 1, wherein a backlight unit is disposed under the first display panel, and the second display panel is disposed on the first display panel, and the display device further comprises a light blocking film disposed between the substrate and the semiconductor layer included in the first display panel.

11. The display device of claim 10, wherein the gate wiring layer covers a side surface and an upper surface of the side end of the flexible film.

12. The display device of claim 11, wherein the data wiring layer and the semiconductor layer are in contact with the side end of the flexible film to form a mounting block, and the gate wiring layer covers the flexible film over the mounting block and extends from the display area to the peripheral area.

13. The display device of claim 12, wherein the flexible film is disposed only in the peripheral area.

14. The display device of claim 13, wherein the flexible film includes at least one of polyimide, polyethylene terephthalate, polycarbonate, polyethylene naphthalate, and polyacrylate.

15. The display device of claim 10, wherein the light blocking film includes a metal material capable of reflecting light.

16. The display device of claim 15, wherein the light blocking film includes one of aluminum, copper or chromium.

17. The display device of claim 1, further comprising a first ohmic contact layer and second ohmic contact layer disposed on the data wiring layer, and wherein the data wiring layer includes a source electrode and a drain electrode spaced apart from each other on the substrate of the first display panel.

18. The display device of claim 17, wherein the first ohmic contact layer and the second ohmic contact layer are disposed on the source electrode and the drain electrode, respectively and wherein the source electrode, the first ohmic contact layer and the semiconductor layer disposed on the source electrode and the interlayer insulating layer are in contact with the side surface of the end of the flexible film.

19. A display device, comprising:
a first display panel including a display area and a peripheral area;
a flexible film disposed in the peripheral area;
a thin film structure disposed on the display area and adjacent to the flexible film;
a second display panel facing the first display panel;
a sealant disposed in the peripheral area of the first display panel to attach the first display panel and the second display panel, wherein the first display panel and the second display panel are disposed in a flipped structure, the first display panel is disposed on the second display panel;
a backlight unit disposed under the second display panel;
wherein the thin film structure comprises:
a substrate;
a data wiring layer disposed on the substrate and in contact with a side end of the flexible film, wherein the data wiring layer includes a source electrode and a drain electrode spaced apart from each other on the substrate of the first display panel;
a semiconductor layer disposed on the data wiring layer;
an interlayer insulating layer disposed on the semiconductor layer;
a gate wiring layer including a gate electrode disposed on the interlayer insulating layer;
a gate insulating layer disposed on the gate wiring layer, wherein the gate wiring layer and the gate insulating layer disposed on the substrate of the first display panel extend from the display area to the peripheral area and the gate wiring layer and gate insulating layer cover the flexible film while passing over a stepped portion of the flexible film at a boundary portion of the display area and the peripheral area; and
a black matrix disposed on the first display panel between a common surface defined by the source electrode, the drain electrode, the semiconductor layer and the substrate of the first display panel.

20. The display device of claim 19, wherein the flexible film is bent along a side surface of the sealant.

21. The display device of claim 19, wherein the source electrode is in contact with the side end of the flexible film.

* * * * *